United States Patent
Ito et al.

(10) Patent No.: US 7,470,342 B2
(45) Date of Patent: Dec. 30, 2008

(54) STRUCTURE AND METHOD FOR LAMINATING AND FIXING THIN PLATE PARTS AND METHOD FOR FABRICATING INK-JET PRINTER HEAD

(75) Inventors: Atsushi Ito, Nagoya (JP); Masaaki Deguchi, Chiryu (JP); Hisaki Sakurai, Chita-gun (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 205 days.

(21) Appl. No.: 11/037,252

(22) Filed: Jan. 19, 2005

(65) Prior Publication Data

US 2005/0139315 A1   Jun. 30, 2005

Related U.S. Application Data

(62) Division of application No. 09/977,956, filed on Oct. 17, 2001, now Pat. No. 6,862,806.

(30) Foreign Application Priority Data

| Oct. 17, 2000 | (JP) | 2000-316587 |
| Feb. 8, 2001 | (JP) | 2001-031911 |
| Aug. 27, 2001 | (JP) | 2001-255644 |

(51) Int. Cl.
  *B32B 15/00* (2006.01)
(52) U.S. Cl. ............... 156/211; 156/252; 156/257; 156/267; 156/513; 402/79; 174/250
(58) Field of Classification Search ........... 402/79; 156/211, 252, 257, 267, 513; 174/250
  See application file for complete search history.

(56) References Cited

U.S. PATENT DOCUMENTS

| 4,033,806 | A | * | 7/1977 | Lindenschmidt | 156/211 |
| 4,347,522 | A | * | 8/1982 | Bahl et al. | 347/76 |
| 4,532,839 | A | * | 8/1985 | Easton | 83/29 |
| 4,611,942 | A | * | 9/1986 | Morse | 402/79 |
| 4,680,595 | A |   | 7/1987 | Crus-Uribe et al. |  |
| 4,928,821 | A | * | 5/1990 | Belko, Jr. | 206/728 |
| 5,114,880 | A |   | 5/1992 | Lin |  |
| 5,165,314 | A | * | 11/1992 | Paulson et al. | 83/29 |
| 5,235,352 | A |   | 8/1993 | Pies et al. |  |
| 5,348,488 | A | * | 9/1994 | Green et al. | 439/140 |

(Continued)

FOREIGN PATENT DOCUMENTS

JP           63062725 A  *  3/1988

(Continued)

*Primary Examiner*—Philip C Tucker
*Assistant Examiner*—Kimberly K McClelland
(74) *Attorney, Agent, or Firm*—Oliff & Berridge, PLC

(57) ABSTRACT

Plates having a predetermined pattern are provided in each frame, side by side, at certain intervals along the longitudinal direction of the frame. A plurality of positioning holes, into which pins are inserted, are formed in each frame. A retainer portion is provided so as to extend from the inner periphery of each positioning hole and is plastically deformed when a pin is inserted thereinto. By inserting a pin into each positioning hole while a plurality of frames are stacked, the outer periphery of the pin contacts the retainer portion of each positioning hole. The retainer portion is deformed to correct misalignment among a plurality of plates.

13 Claims, 18 Drawing Sheets

U.S. PATENT DOCUMENTS

| | | |
|---|---|---|
| 5,402,159 A | 3/1995 | Takahashi et al. |
| 5,661,086 A * | 8/1997 | Nakashima et al. ......... 257/668 |
| 5,791,660 A * | 8/1998 | Belter ....................... 277/598 |
| 5,907,340 A | 5/1999 | Katakura et al. |
| 6,440,174 B1 | 8/2002 | Usui et al. |
| 2003/0049424 A1* | 3/2003 | Yamaguchi et al. ......... 428/209 |

FOREIGN PATENT DOCUMENTS

| | | |
|---|---|---|
| JP | 04134898 A * | 5/1992 |
| JP | 5-162318 | 6/1993 |
| JP | A-5-167951 | 7/1993 |
| JP | A-9-039243 | 2/1997 |
| JP | A-9-183125 | 7/1997 |
| JP | A-9-187931 | 7/1997 |
| JP | A-11-254689 | 9/1999 |
| JP | A-2000-246363 | 9/2000 |

* cited by examiner

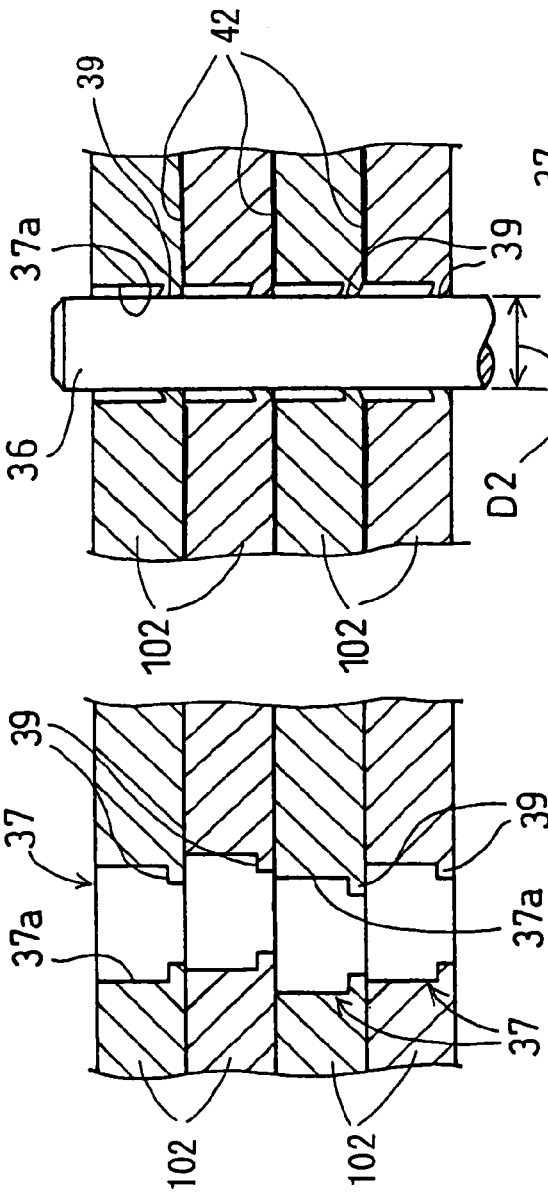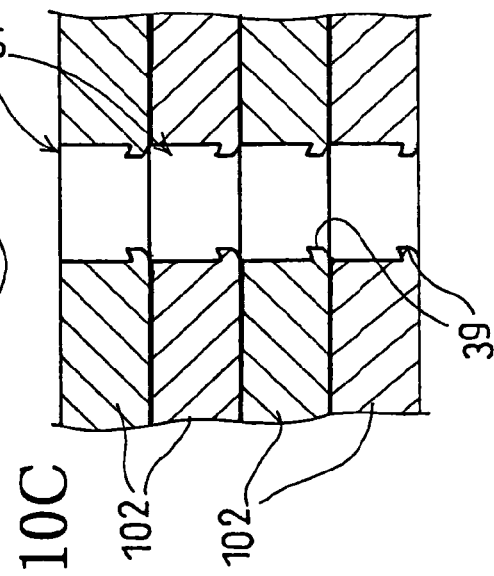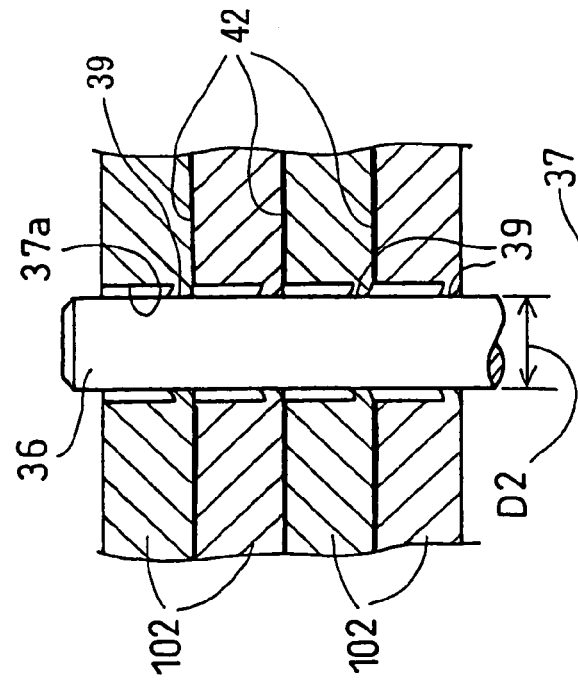

STRUCTURE AND METHOD FOR LAMINATING AND FIXING THIN PLATE PARTS AND METHOD FOR FABRICATING INK-JET PRINTER HEAD

This is a Division of application Ser. No. 09/977,956 filed Oct. 17, 2001, now U.S. Pat. No. 6,862,806, the entire disclosure of which is hereby incorporated by reference herein in its entirety.

BACKGROUND OF THE INVENTION

1. Field of Invention

The invention relates to a structure and method for laminating and fixing lead frames that are used to assemble thin plate parts used for an ink-jet printer head and an electronic part, and also relates to a method for fabricating ink-jet printer heads.

2. Description of Related Art

An on-demand type piezoelectric ink-jet printer head is disclosed in U.S. Pat. No. 4,680,595. The disclosed head includes a cavity plate formed by laminating a plurality of thin plate parts and a diaphragm plate bonded to the back side of the cavity plate.

A plurality of thin plate parts forming a cavity plate includes a nozzle plate having a plurality of nozzles, a base plate having pressure chambers associated with the nozzles, and a manifold plate having a manifold and ink passages connected to an ink source and to the pressure chambers. Each plate is a thin metal plate having a thickness of 25 μm or less. A plurality of plates are positioned such that the nozzles, pressure chambers, and ink passages communicate with each other, and are laminated in predetermined vertical alignment.

Piezoelectric elements are securely fixed to one side of the diaphragm plate so as to be associated with the pressure chambers.

SUMMARY OF THE INVENTION

The invention provides a structure and method for laminating thin plate parts, which are used for an ink-jet printer head and an electronic part, accurately in proper alignment, and also provides a method for fabricating an ink-jet printer head.

More specifically, the invention provides a structure and method for laminating and fixing a plurality of lead frames, each having a plurality of thin plate parts arranged side by side.

The invention also provides an ink-jet head and a method for fabricating same. An ink-jet head is fabricated by laminating a plurality of thin plate parts, each having an ink passage, such that an ink passage of one thin plate part communicate with an ink passage of another thin plate part.

BRIEF DESCRIPTION OF THE DRAWINGS

A preferred embodiment of the invention will be described with reference to the following figures wherein:

FIG. 10A is a partially enlarged cross-sectional view showing positioning holes of the lead frames;

FIG. 10B is a partially enlarged cross-sectional view showing the positioning holes and a pin;

FIG. 10C is a partially enlarged cross-sectional view showing the fixedly laminated lead frames from which the pin has been removed;

DETAILED DESCRIPTION OF PREFERRED EMBODIMENTS

U.S. patent application Ser. Nos. 09/897,394; 09/933,155; 09/933,156; and, U.S. patent application titled LAMINATED AND BONDED CONSTRUCTION OF THIN PLATE PARTS filed with the U.S. Patent and Trademark Office on Sep. 21, 2001, are incorporated herein by reference in their entirety.

A piezoelectric ink-jet printer head embodying the invention will be described in conjunction with the attached drawings.

Figure 1:
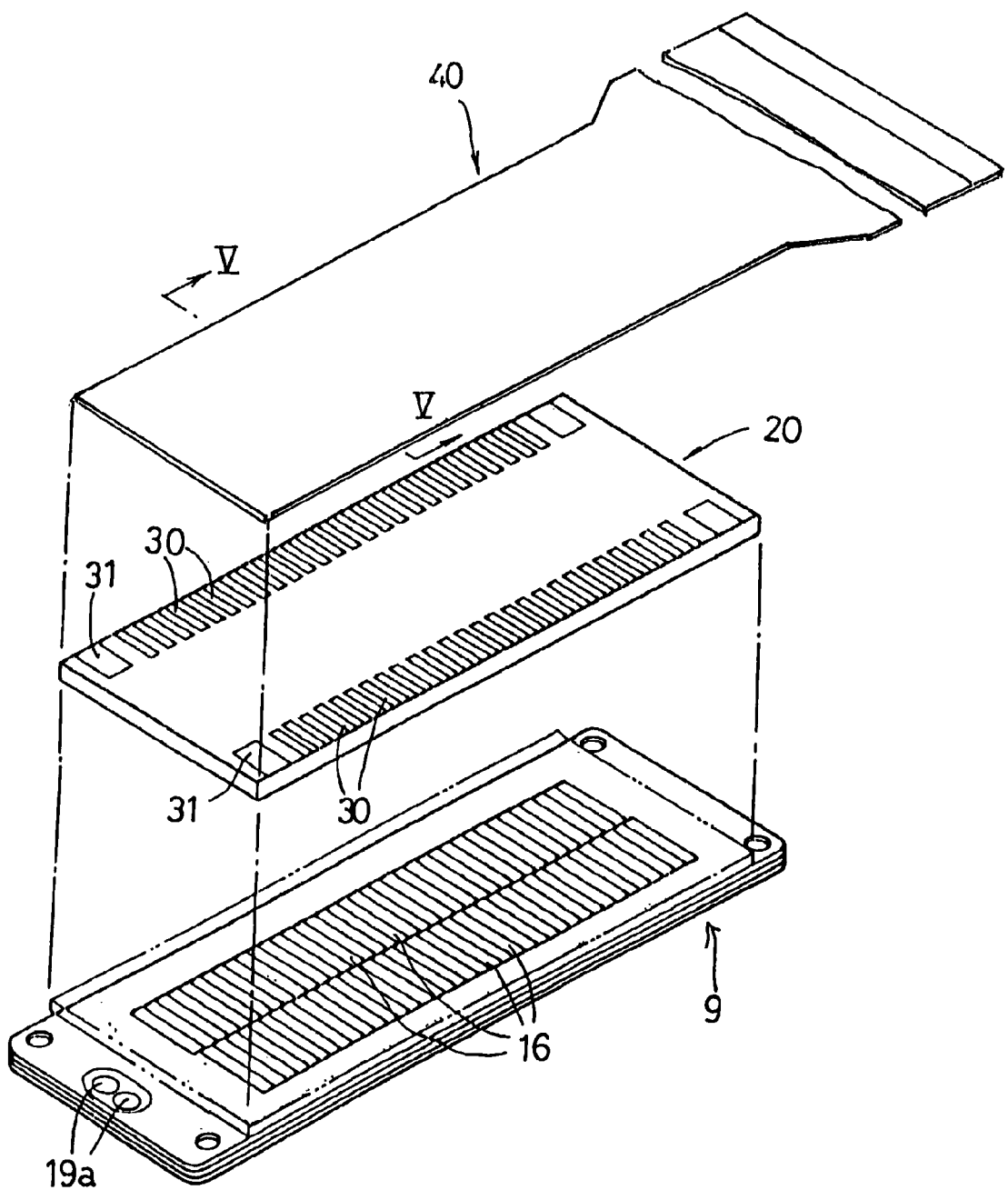
FIG. 1 is an exploded perspective view of a piezoelectric ink-jet printer head according to an embodiment of the invention.
Figure 5:
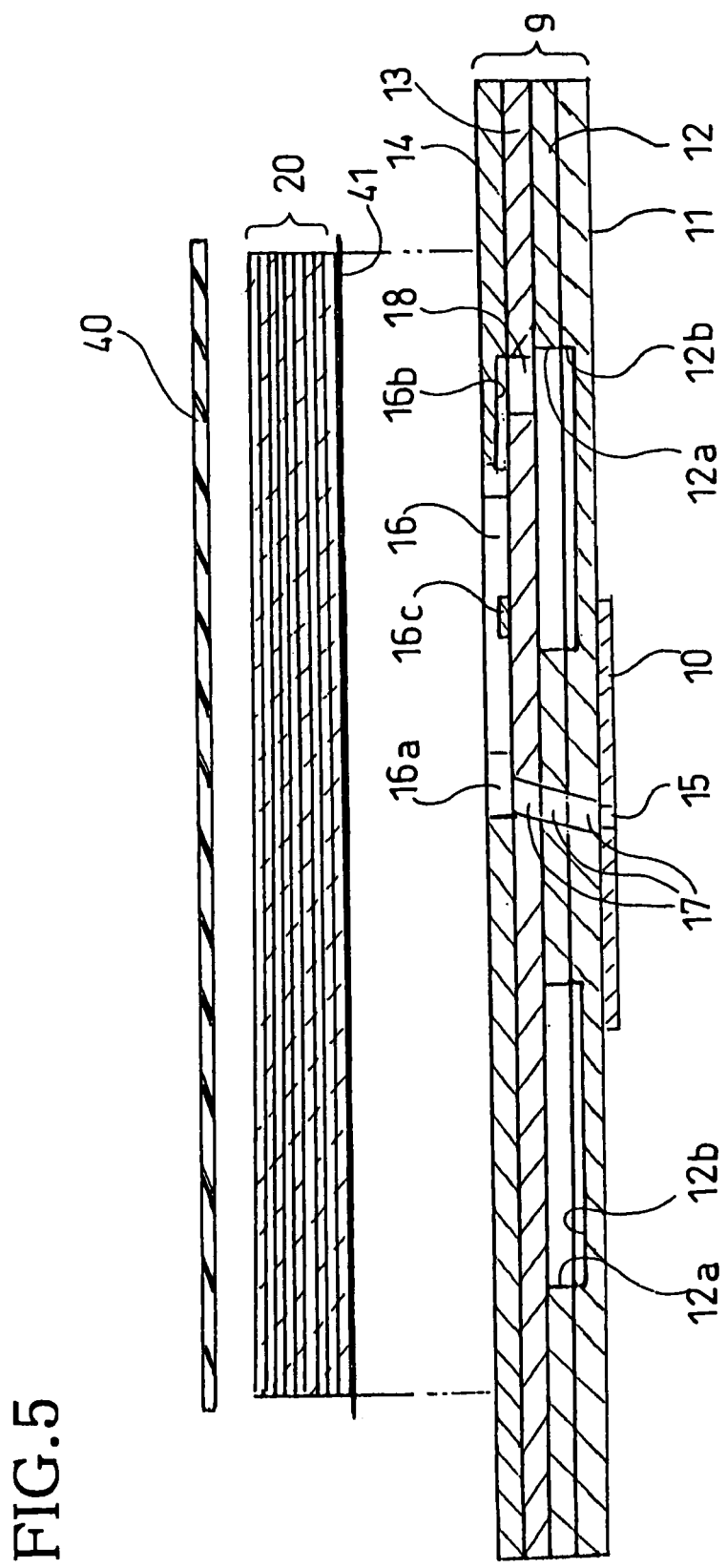
FIG. 5 is an enlarged cross-sectional view taken along line V-V of FIG. 1.

In FIG. 1, a flexible flat cable 40 is bonded, using an adhesive, to the upper surface of a plate type piezoelectric actuator 20 so as to establish an electrical connection with an external device. The piezoelectric actuator 20 is bonded to a metal cavity plate 9. Ink is ejected downward from nozzles 15, as shown in FIG. 5, which open toward the underside of the cavity plate 9 at the bottom.

As shown in FIGS. 2 through 5, the cavity plate 9 is constructed by laminating, using an adhesive, five thin metal plates, namely, a nozzle plate 10, two manifold plates 11, 12, a spacer plate 13, and a base plate 14.

Figure 3:
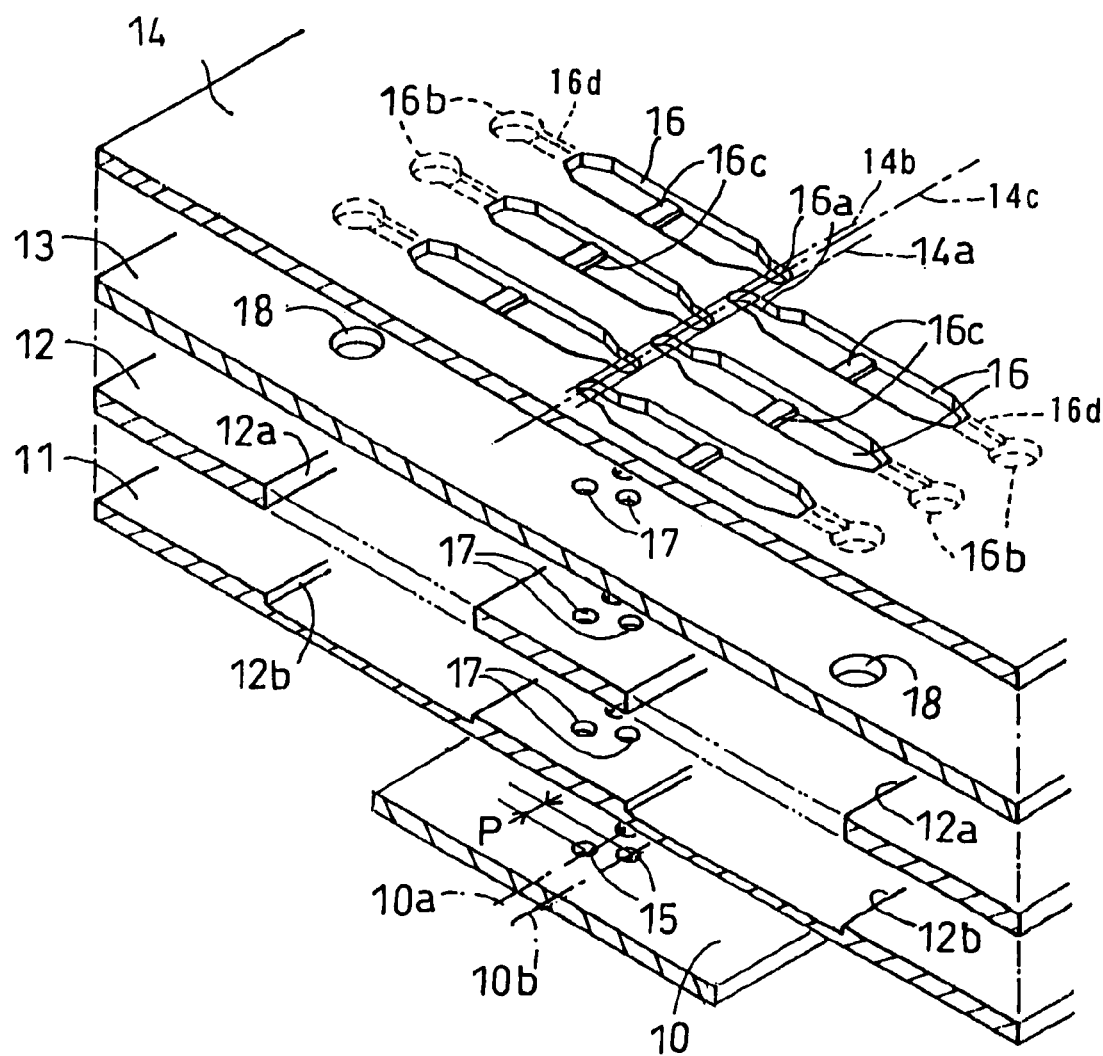
FIG. 3 is a partially exploded and enlarged perspective view of the cavity plate.

The nozzle plate 10 is made of a synthetic resin and is provided with the nozzles 15, which are as small as about 25 μm in diameter and arranged in two rows in a staggered configuration, along a longitudinal direction of the nozzle plate 10. Specifically, as shown in FIG. 3, a number of nozzles 15 with a small pitch of P are provided in a staggered configuration, along two reference lines 10a, 10b extending parallel to the longitudinal direction of the nozzle plate 10.

Each of the plates 11, 12, 13, 14 is a steel plate about 50-150 μm thick alloyed with 42% nickel. Alternatively, these plates may be resin plates.

In the manifold plates 11, 12, ink passages 12b, 12a are provided, respectively, so as to extend along both sides of the rows of nozzles 15. The ink passages 12b are recessed in the lower manifold plate 11, which is contiguous to the nozzle plate 10, so as to be open only toward the upper side of the lower manifold plate 11. The ink passages 12a in the upper manifold plate 12, which overlies the lower manifold plate 11, are formed through the manifold plate 12 into the same shape as the ink passages 12b.

In the manifold plates 11, 12, through holes 17 are formed at positions to be aligned with the nozzles 15 when the manifold plates 11, 12 are laminated to the nozzle plate 10.

The ink passages 12a, 12b are closed by the spacer plate 13 contiguous to the upper manifold plate 12. Likewise, through holes 17 are formed in the spacer plate 13.

In the base plate 14, a number of narrow pressure chambers 16 are provided so as to extend in the lateral direction perpendicular to the center line 14c extending along the longitudinal direction. When longitudinal parallel reference lines 14a, 14b are drawn on the right and left sides of the center line 14c, the ends of end passages 16a of the pressure chambers 16 on the left side of the center line 14c are aligned with the right longitudinal reference line 14a, while the ends of end passages 16a of the pressure chambers 16 on the right side of the center line 14c are aligned with the left longitudinal reference line 14b. The opposed end passages 16a of the right and left pressure chambers 16 are arranged in an interlaced relationship. Thus, the right and left pressure chambers 16 extend alternately beyond the center line 14c.

The end passage 16a of each of the pressure chambers 16 is positioned so as to be aligned with an associated one of the nozzles 15. The end passages 16a communicate with the spacer plate 13 and the manifold plates 11, 12, via the through holes 17, which are arranged in a staggered configuration similar to the nozzles 15.

At the other end of each narrow pressure chamber 16, the pressure chambers 16 are connected to large-diameter hole end passages 16b, via elongated narrow grooves 16d having a small cross-sectional area. The large-diameter hole end passages 16b communicate with the ink passages 12b, 12a in the manifold plates 11, 12, via through holes 18 formed on right and left sides of the spacer plate 13. As shown in FIG. 3, the large-diameter hole end passages 16b are recessed so as to be open only toward the underside of the base plate 14. The other end passages 16b are substantially equal, in diameter, to the through holes 18.

A connecting member 16c about half the thickness of the base plate 14 is provided for each of the pressure chambers 16 at its longitudinally intermediate position so as to enhance the rigidity of sidewalls of a number of pressure chambers 16 arranged in rows.

Figure 2:
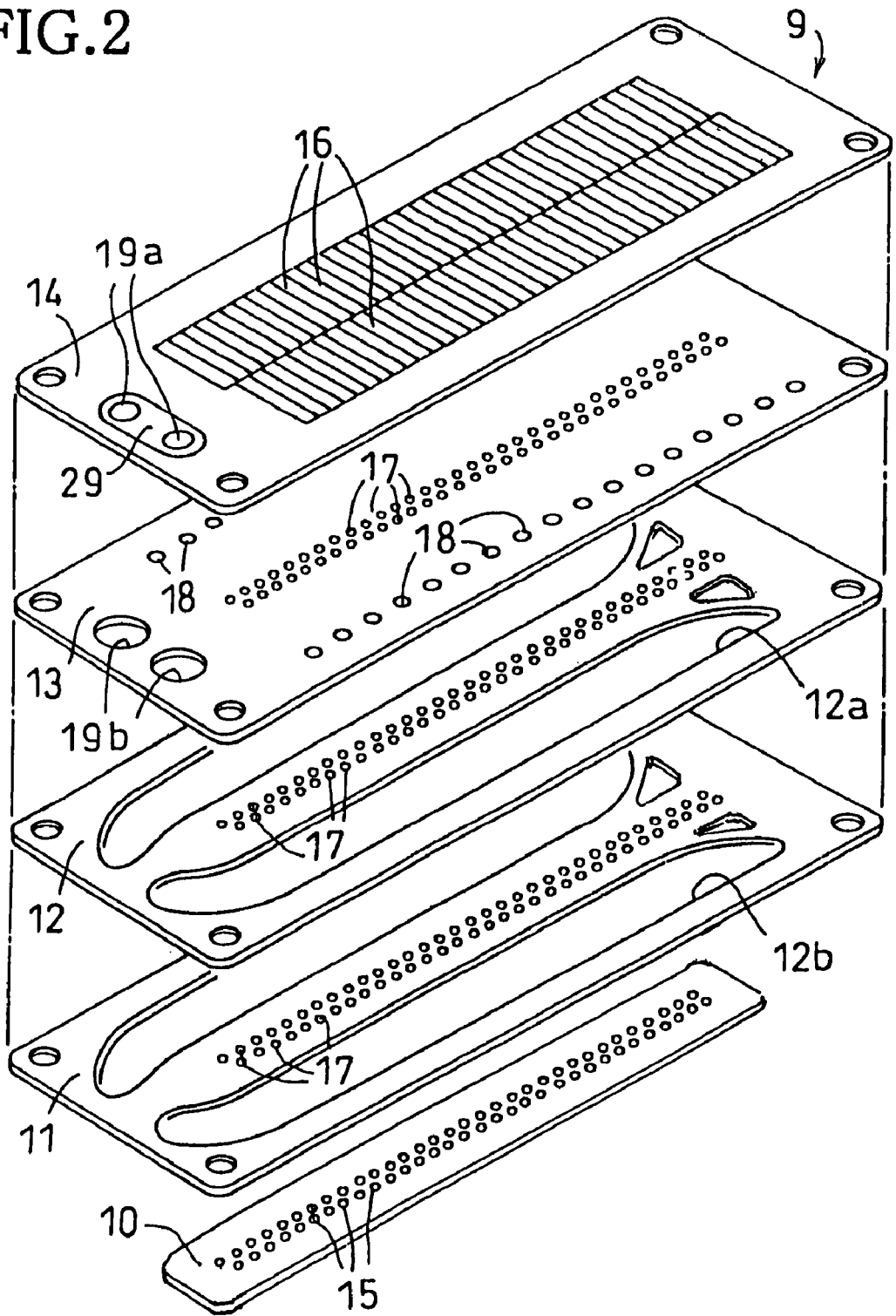
FIG. 2 is an exploded perspective view of a cavity plate.

As shown in FIG. 2, at one end of the base plate 14, supply holes 19a are formed therethrough so as to supply ink from an ink tank disposed above the base plate 14. A filter 29 is provided over the supply holes 19a so as to remove foreign matter from the ink.

Also as shown in FIG. 2, at one end of the spacer plate 13, supply holes 19b are formed therethrough so as to communicate with the supply holes 19a. The supply holes 19b are positioned so as to be aligned with and communicate with end portions of the ink passages 12a, 12b.

Accordingly, ink fed from the supply holes 19a, 19b flows to the ink passages 12a, 12b and passes through each of the through holes 18, thereby to be directed to each of the pressure chambers 16. After that, the ink passes through each of the through holes 17 aligned with each of the end passages 16a of the pressure chambers 16 and reaches an associated one of the nozzles 15.

Figure 4:
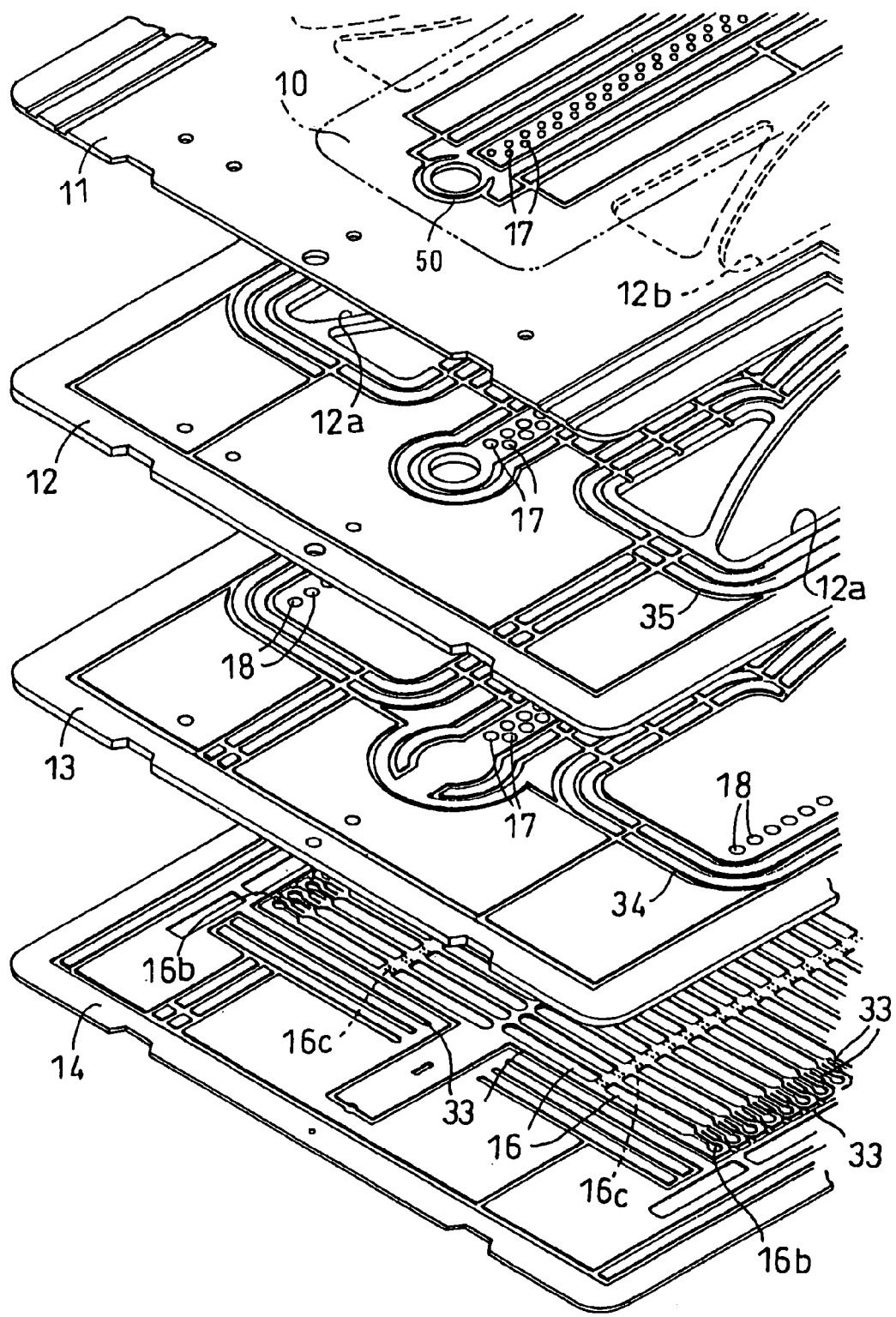
FIG. 4 is an exploded perspective view of the cavity plate with its nozzles facing upward.

On the lower surface of the manifold plate 11, that is, on the surface of the manifold plate 11 that comes into contact with the nozzle plate 10, grooves 50 are formed as shown in FIG. 4. Particularly, the grooves 50 are concentrated in the vicinity of the through holes 17. The cross-sectional area of each groove 50 in its depth direction is adapted to be smaller than that of each through hole 17.

On the lower surface of the manifold plate 12, that is, on the surface of the manifold plate 12 that comes into contact with the manifold plate 11, grooves 35 are formed lengthwise and crosswise as shown in FIG. 4. Particularly, the grooves 35 are concentrated in the vicinity of the ink passages 12a and the through holes 17. The vertical cross-sectional area of each groove 35 is adapted to be smaller than that of each through hole 17. Hereinafter, it is to be understood that when the term "vertical cross-sectional area" is used, it refers to the cross-sectional area of a groove or a hole in its depth direction.

On the lower surface of the spacer plate 13, that is, on the surface of the spacer plate 13 that comes into contact with the manifold plate 12, grooves 34 are formed lengthwise and crosswise as shown in FIG. 4. Particularly, the grooves 34 are concentrated in the vicinity of the through holes 17, 18. The vertical cross-sectional area of each groove 34 is adapted to be smaller than that of each hole 17, 18.

On the lower surface of the base plate 14, that is, on the surface of the base plate 14 that comes into contact with the spacer plate 13, grooves 33 are formed as shown in FIG. 4.

These grooves 33, 34, 35, 50 are formed to prevent an adhesive from entering the ink passages 12a, 12b, nozzles 15, pressure chambers 16, through holes 17, 18, and supply holes 19a, 19b.

Figure 6:
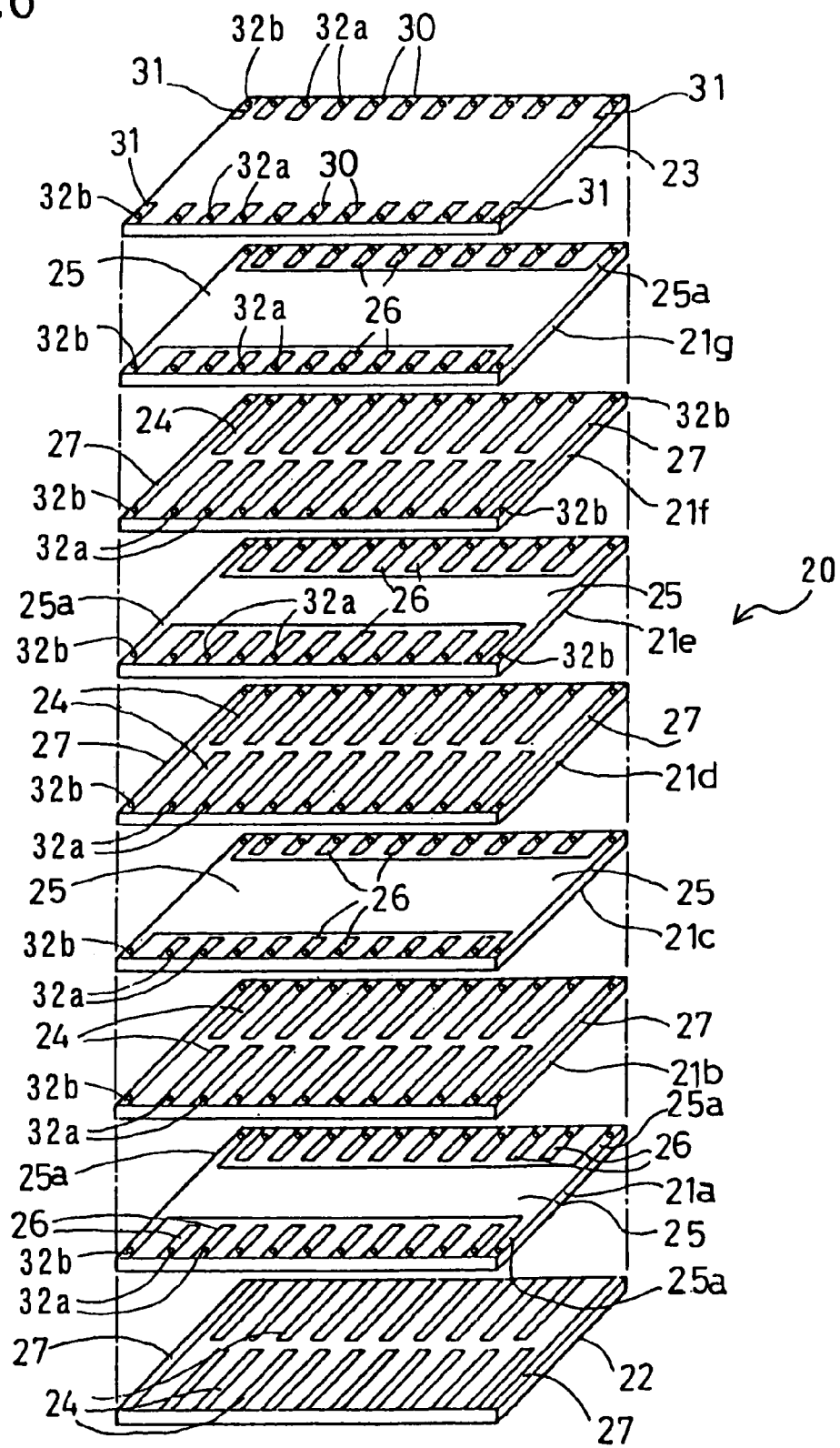
FIG. 6 is an exploded perspective view of a piezoelectric actuator.

As shown in FIG. 6, the piezoelectric actuator 20 is constructed by laminating nine piezoelectric sheets 21a, 21b, 21c, 21d, 21e, 21f, 21g, 22, 23. On the upper surface of the lowermost piezoelectric sheet 22 and on the upper surface of each of piezoelectric sheets 21b, 21d, 21f, individual electrodes 24 are formed in rows along the longitudinal direction so as to be aligned with the respective pressure chambers 16 in the cavity plate 9. On the piezoelectric sheets 21b, 21d, 21f, the individual narrow electrodes 24 extend laterally to the longitudinal direction and terminate close to the longitudinal edges of the sheets 21b, 21d, 21f. On the upper surface of piezoelectric sheets 21a, 21c, 21e, 21g from the bottom, a common electrode 25 is formed so as to be aligned with the pressure chambers 16.

Each of the individual electrodes 24 is designed to be slightly smaller in width than the associated pressure chamber 16.

The pressure chambers 16 are generally centered in the lateral direction and arranged in two rows along the longitudinal direction. In order to cover the two-row pressure chambers, the common electrode 25 in each of piezoelectric sheets 21a, 21c, 21e, 21g is formed into a rectangular shape centered in the lateral direction and extending in the longitudinal direction. In addition, near the lateral edges of each of piezoelectric sheets 21a, 21c, 21e, 21g, lead portions 25a are integrally formed with the common electrode 25 so as to extend throughout the lateral edges.

On the upper surface of each of piezoelectric sheets 21a, 21c, 21e, 21g, dummy individual electrodes 26 are formed at positions along the longitudinal edges outside the common electrode 25. The dummy individual electrodes 26 are aligned with the individual electrodes 24, and have a substantially equal width and a shorter length, compared with the individual electrodes 24.

On the upper surface of the piezoelectric sheet 22 at the bottom and on the upper surface of each of piezoelectric sheets 21b, 21d, 21f, dummy common electrodes 27 are formed near the lateral edges throughout their length in alignment with the contiguous lead portions 25a, 25a.

On the upper surface of the top sheet 23 at the top, surface electrodes 30 are provided along the longitudinal edges so as to be aligned with the respective individual electrodes 24. In addition, at the four corners of the upper surface of the top sheet 23, surface electrodes 31 are provided so as to be aligned with the lead portions 25a of the common electrode 25.

In the piezoelectric sheets 21a, 21b, 21c, 21d, 21e, 21f, 21g and the top sheet 23, through holes 32a are formed such that the surface electrodes 30 communicate with the aligned individual electrodes 24 and dummy individual electrodes 26. Similarly, through holes 32b are formed at the four corners such that the surface electrodes 31 of the top sheet 23 communicate with the aligned lead portions 25a of each common electrode 25, and the aligned dummy common electrodes 27.

By filling the through holes 32a, 32b with a conductive material, the individual electrodes 24, the dummy individual electrodes 26, and the surface electrodes 30, which are aligned with each other in the laminating direction, are electrically connected. Likewise, the common electrodes 25, the dummy common electrodes 27, and the surface electrodes 31 on the top sheet 23, which are aligned with each other, are electrically connected.

Figure 7:
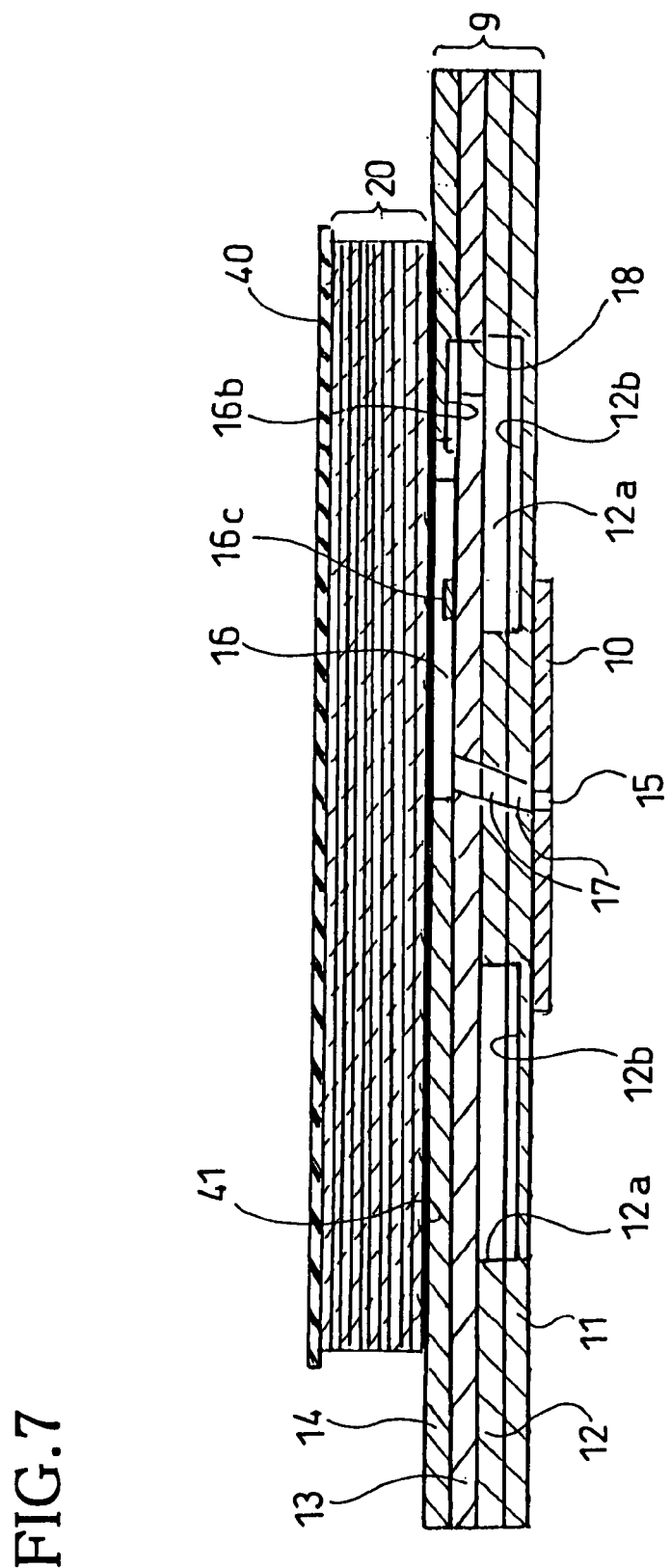
FIG. 7 is an enlarged cross-sectional view of a flexible flat cable, the cavity plate, and the piezoelectric actuator that are bonded together.
Figure 8:
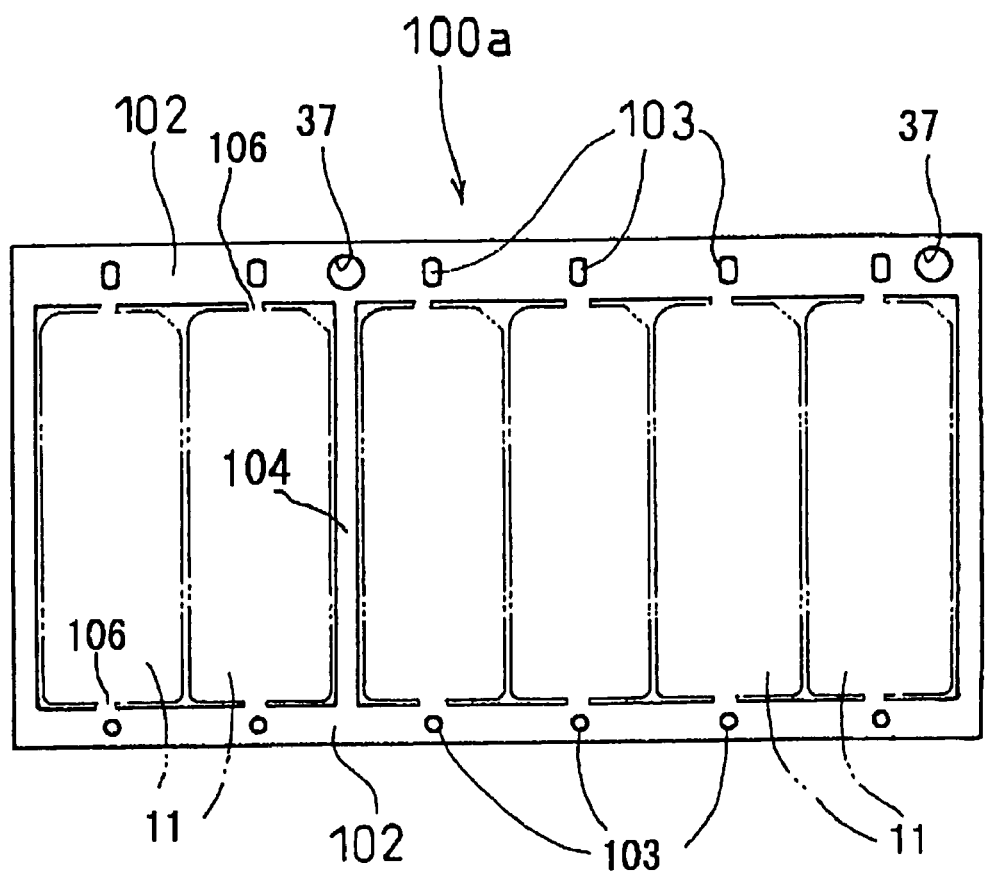
FIG. 8 is a plan view of a lead frame.

In addition, as shown in FIG. 7, an adhesive sheet 41 made of an ink-impermeable synthetic resin is bonded entirely to the lower surface of the piezoelectric actuator 20, that is, the lower surface of the piezoelectric sheet 22. Then, the piezoelectric actuator 20 is bonded to the cavity plate 9 such that the individual electrodes 24 in the piezoelectric actuator 20 are aligned with the respective pressure chambers 16. Consequently, the adhesive sheet 41 is bonded to the base plate 14 of the cavity plate 9 at portions other than the pressure chambers 16, thereby securing the piezoelectric actuator 20 to the cavity plate 9. In addition, a flexible flat cable 40 is pressed onto the upper surface of the piezoelectric actuator 20, that is, onto the upper surface of the top sheet 23, and various wiring patterns (not shown) are electrically connected to each of the surface electrodes 30, 31.

Fabrication of an ink-jet printer head is now completed.

An ink-impermeable and electrically insulative material should be used for the adhesive sheet 41. More specifically, it is preferable to use a film of polyamide hotmelt adhesive mainly composed of a nylon base or dimer-acid base polyamide resin, or a film of polyester base hotmelt adhesive. Alternatively, the piezoelectric sheet 22 may be bonded to the cavity plate 9 by applying first a polyolefin base hotmelt adhesive to the lower surface of the piezoelectric sheet 22. The thickness of the adhesive layer is preferably about 1 μm.

In order to eject ink from the ink-jet printer head, an electric potential is applied, through the flat cable 40, to the surface electrodes 30 associated with the nozzles from which ink is to be ejected to cause a potential difference between the surface electrodes 30 and the surface electrodes 31. This causes a potential difference between the individual electrodes 24 aligned with the above surface electrodes 30 and the common electrodes 25. Then, portions of the piezoelectric sheets 21 associated with the above individual electrodes 24 deform in the laminated direction so as to increase the volume of the associated pressure chambers 16, thereby causing ink to flow into these pressure chambers 16. The ink flows from the ink passages 12a, 12b provided in the manifold plates 11, 12, respectively, to store the ink supplied from the supply holes 19a, 19b. When the electric potential applied to the surface electrodes 30 is cancelled, the deformed piezoelectric sheets 21 return to their original state, and the volume of the associated pressure chambers 16 is reduced. Due to the pressure applied to these pressure chambers 16 when their volume is reduced, ink is ejected from the associated nozzles 15 through the associated through holes 17.

A structure and method for assembling the cavity plate 9 will be now be described.

Figure 9:
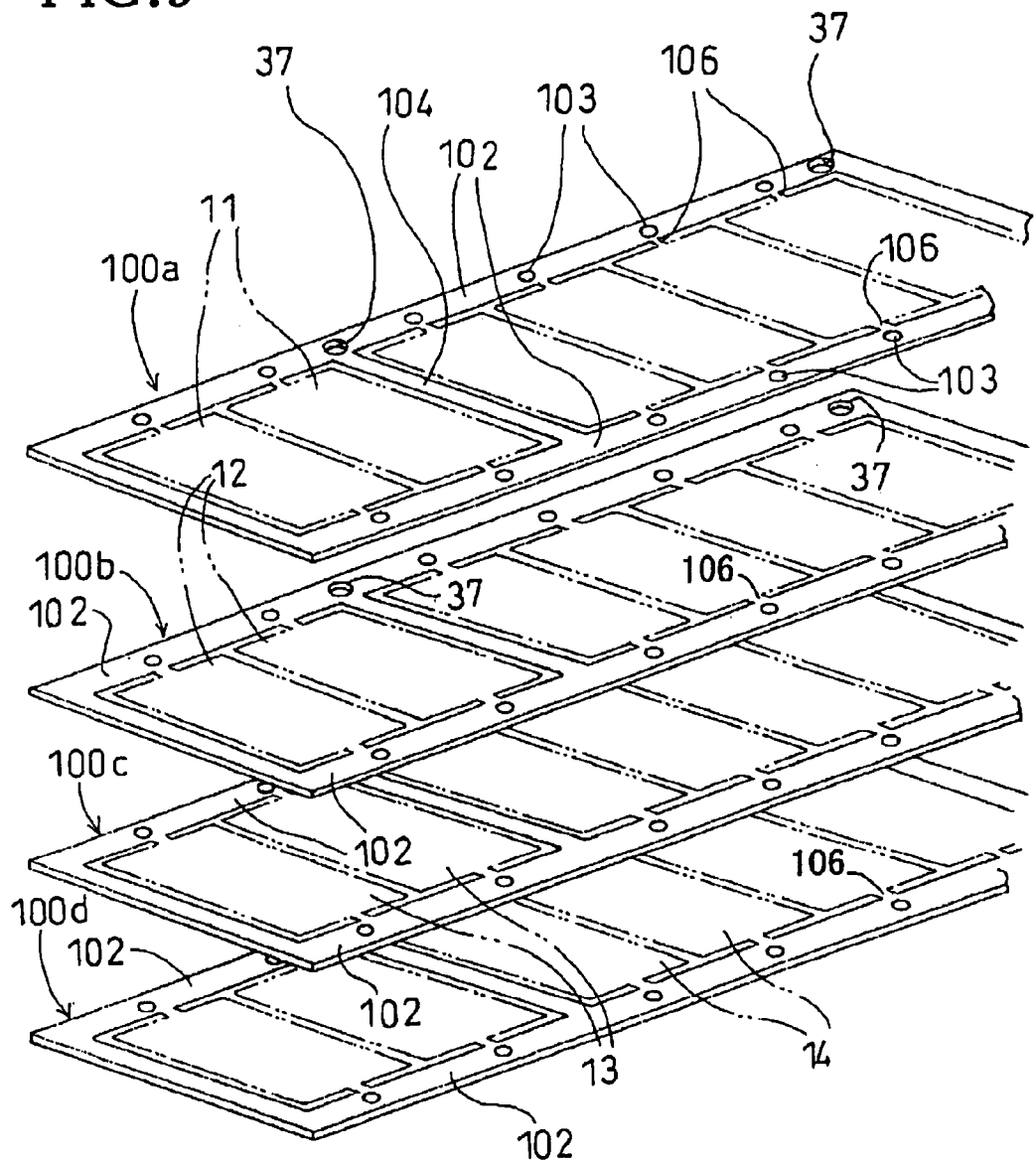
FIG. 9 is a perspective view showing how lead frames are laminated.

Each lead frame 100a-100d shown in FIG. 9 is formed from a sheet of steel plate alloyed with 42% nickel. Each lead frame 100a-100d has a rectangular frame 102 and a plurality of manifold plates 11 or 12, spacer plates 13, or base plates 14, which are arranged at certain intervals and enclosed by the rectangular frame 102. Each frame 102 and its associated plates 11, 12, 13, or 14 are linked by connecting pieces 106, which are far narrower in width than the plates 11-14. Such a frame 102 is formed by etching or punching a sheet of steel plate.

An ink path pattern, such as the ink passages 12a, 12b, pressure chambers 16, and through holes 17, provided for each plate 11-14 is simultaneously formed by etching or punching.

A pair of longitudinally extending sides of each frame 102 are linked by a tie bar 104 to maintain rigidity in the frame 102. Positioning holes 37 and feed holes 103 are provided at appropriate intervals in the pair of longitudinal sides. Projections from a conveyor belt (not shown) are engaged in the feed holes 103. As the conveyor belt moves, the frame 102 moves.

The configuration of the positioning holes 37 in each frame 102 is common to the plates 11-14. In addition, the interval between plates 11-14 arranged in each frame 102 is common to the plates 11-14. Thus, when four frames 102 having the plates 11, 12, 13, and 14, respectively, are precisely stacked, the positioning holes 37 formed in the respective frames 102 are vertically aligned, and sets of four plates 11-14 are also vertically aligned.

A method for laminating the lead frames 100a-100d will now be described.

After applying an adhesive to one side of each plate 11-14, the lead frames 100a-100d are laminated upside down relative to the normal service state (FIG. 2) of the cavity plate 9 where the nozzles 15 are open toward the underside of the cavity plate 9. As shown in FIG. 9, the lead frame 100d having base plates 14, the lead frame 100c having spacer plates 13, the lead frame 100b having manifold plates 12, and the lead frame 100a having manifold plates 11 are disposed in this order from bottom to top.

At this time, the grooves 33, 34, 35, 50 formed on one side of each plate 11-14 are open upwardly, as shown in FIG. 4.

As shown in FIGS. 10A-10C, when the lead frames 100a-100d are laminated, pins 36 provided in a jig (not shown) so as to project therefrom are inserted into the positioning holes in the frames 102 from bottom to top.

Figure 11A:
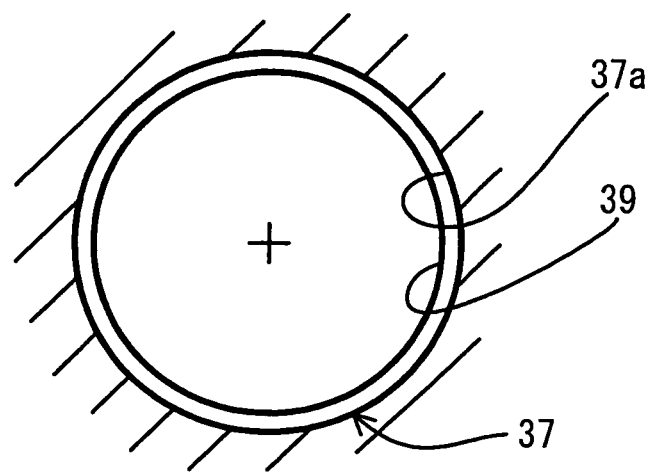
FIG. 11A is a plan view of a positioning hole and a retainer portion.
Figure 11B:
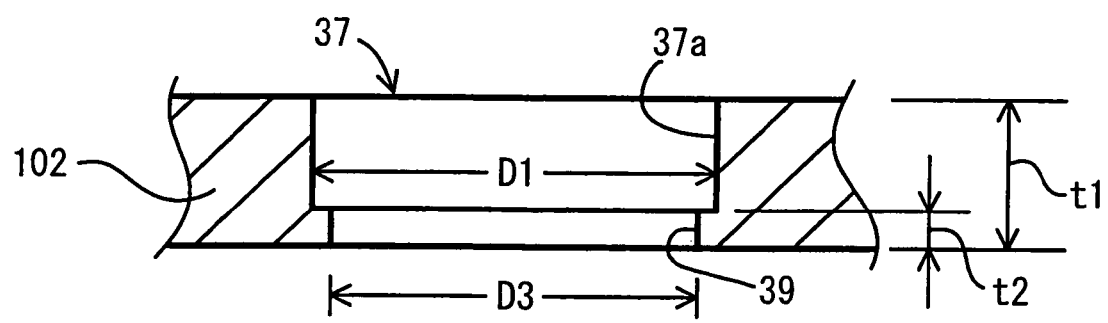
FIG. 11B is a cross-sectional view of the positioning pin.

As shown in FIGS. 11A and 11B, each positioning hole 37 has a large-diameter portion 37a having a diameter slightly larger than the outside diameter D2 of the pin 36, and a retainer portion 39 having the inside diameter D3 much smaller than the outside diameter D2 of the pin 36. The thickness of the retainer portion 39 is set to be about one-thirds the thickness of the frame 102. The retainer portion 39 is designed to be deformed, preferably plastically, along the periphery of the pin 36. The retainer portion 39 extends inwardly from the inner peripheral wall of the large-diameter portion 37a and is circular in the plan view.

When a pin 36 is inserted into each positioning hole 37 provided in the frame 102 of the lead frame 100d at the bottom, the outer peripheral surface of the pin 36 elastically deforms the retainer portion 39 in the downstream direction from the insertion side, that is, upwardly, as shown in FIG. 10B. As a result, the lead frame 100d is positioned, without a rattle, with respect to the pin 36.

Then, the pin 37 is inserted into the positioning hole 37 provided in the frame 102 of the lead frame 100c placed over the lead frame 100d. Before insertion of the pin 36, the lead frame 100c is shifted from the lead frame 100d and their positioning holes 37, 37 are not aligned with each other. Upon insertion of the pin 36 into the positioning hole 37 in the frame 102 of the lead frame 100c, the outer periphery of the pin 36 plastically deforms the retainer portion 39 such that the pin 36 and the positioning hole 37 are axially aligned. As a result, the lead frames 100c and 100d are stacked without an error.

Likewise, by stacking the lead frame 100b and inserting the pin 36 into a positioning hole 37 in the lead frame 100b, and by stacking the lead frame 100a and inserting the pin 36 into a positioning hole 37 in the lead frame 100a, the positioning holes 30 in the laminated lead frames 100a-100d and the pin 36 are axially aligned. By removing the pin 36 after the lead frames 100a-100d are fixed in this state, vertical alignment of the laminated lead frames 100a-100d is maintained, as shown in FIG. 10C.

Several methods can be used to fix the lead frames 100a-100d after applying an adhesive 42 to one side of each plate 11-14 and inserting pins 36 into positioning holes 37 in the lead frames 100a-100d. One method is to apply a pinching or pressing force to the lead frame 100d at the bottom and the lead frame 100a at the top to securely bond the lead frames 100a-100d. Another method is to solder edges of each set of laminated plates 11-14. Still another method is to pinch each set of laminated plates 11-14 using a clip (not shown).

After that, by cutting the connecting pieces 106 of the lead frames 100a-100d, each set of laminated plates 11-14 are removed from the frames 102. By bonding the nozzle plate 10 to each set of laminated plates 11-14 before or after such removal, a plurality of cavity plates 9 are fabricated.

The retainer portion 39 may be elastically deformed, instead of plastically deformed. In this case, the retainer portion 39 is deformed as long as the pin 36 contacts the retainer portion 39, and returns to its original state when the pin 36 is removed. However, a plastically deformed retainer portion is preferable because it is not reversible even after the pin 36 is removed and effectively keeps the ink path pattern formed in each plate 11-14, such as the ink passages 12a, 12b and the pressure chambers 16, in proper alignment, with high accuracy.

FIGS. 12A-12D and 13A-13C show modified retainer portions.

Figure 12A:
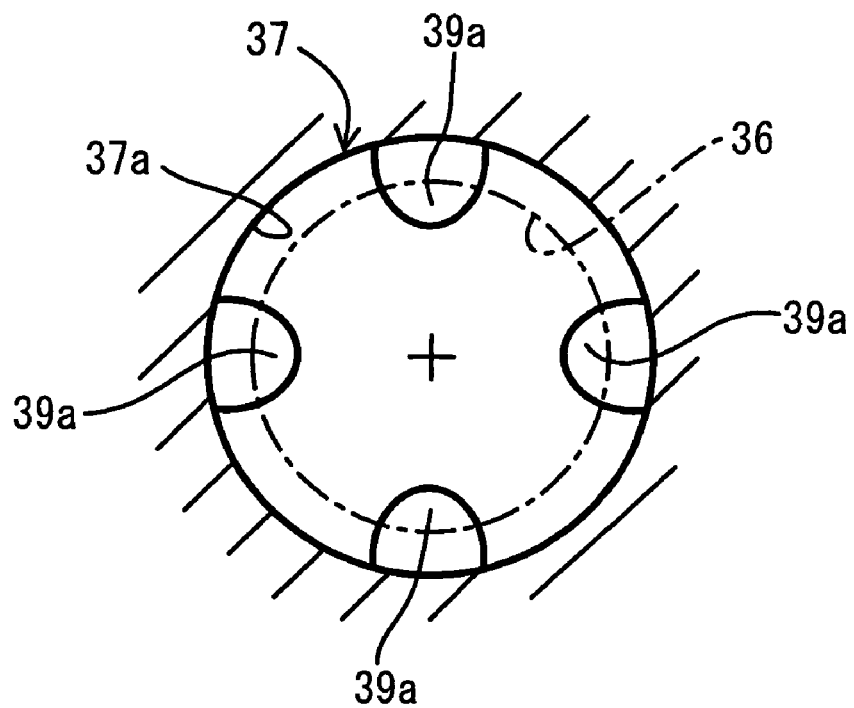
FIG. 12A is a plan view of a positioning hole with four retainer portions.

In FIG. 12A, four retainer portions 39a extend inwardly from the inner peripheral wall of the large-diameter portion 37a of the positioning hole 37. The free end of each retainer portion 39a is convex and semicircular in the plan view.

Figure 12B:
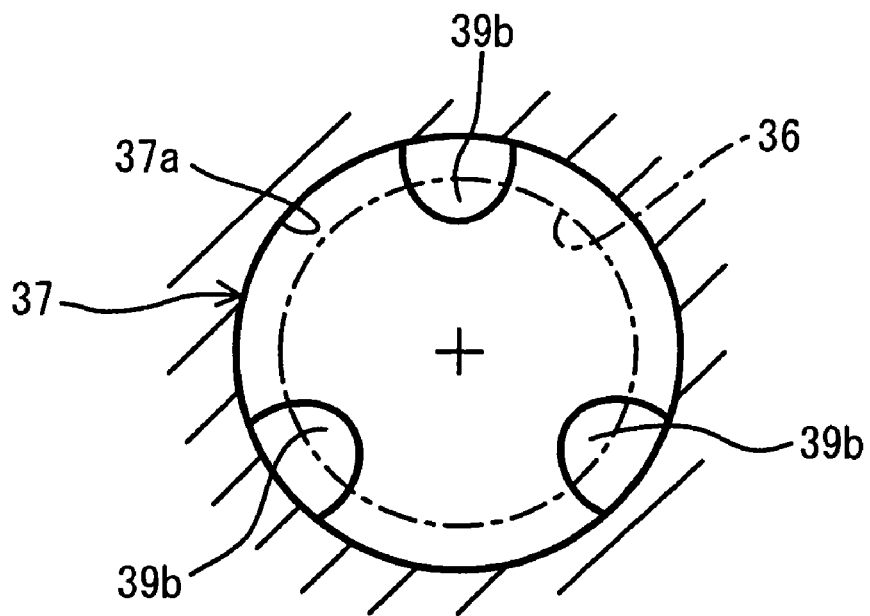
FIG. 12B is a plan view of a positioning hole with three retainer portions.

In FIG. 12B, three retainer portions 39b extend inwardly from the inner peripheral wall of the large-diameter portion 37a of the positioning hole 37. The free end of each retainer portion 39a is convex and semicircular in the plan view.

Figure 12C:
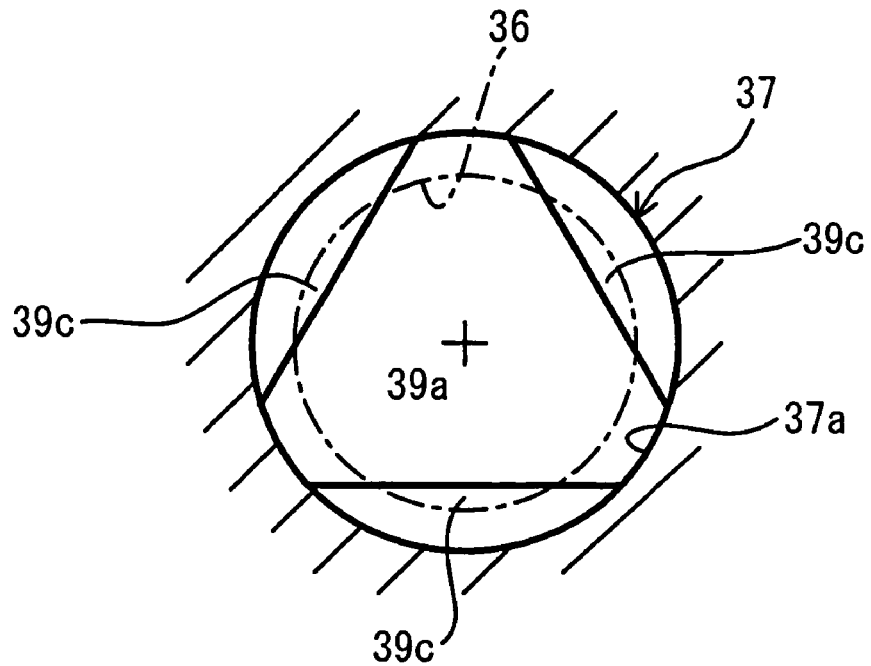
FIG. 12C is plan view of a positioning hole with three retainer portions whose free ends are linear.

In FIG. 12C, three retainer portions 39c extend inwardly from the inner peripheral wall of the large-diameter portion 37a of the positioning hole 37. The free end of each retainer portion 39c is linear in the plan view.

Figure 12D:
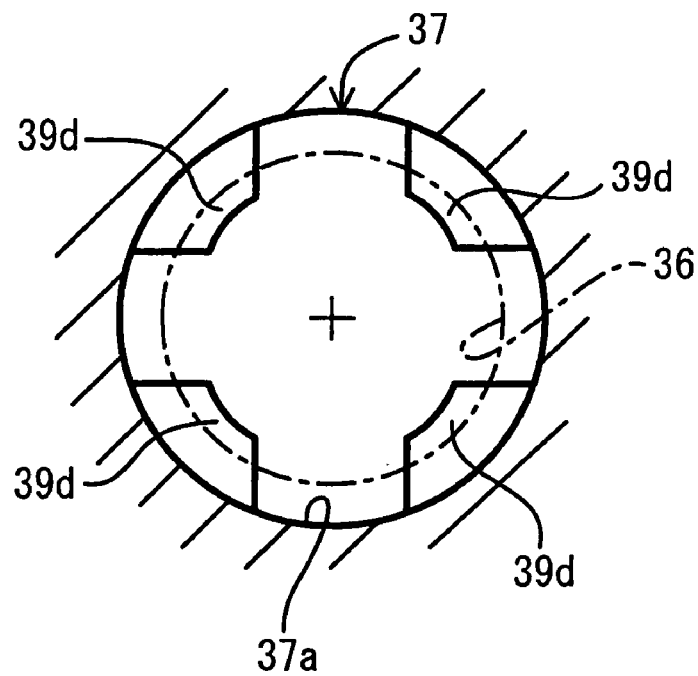
FIG. 12D is a plan view of a positioning hole with four retainer portions that are mountain-shaped in the plan view.

In FIG. 12D, four retainer portions 39d extend inwardly from the inner peripheral wall of the large-diameter portion 37a of the positioning hole 37. The free end of each retainer portion 39d is mountain-shaped in the plan view.

As with the retainer portion 39 in FIGS. 11A and 11B, these retainer portions 39a, 39b, 39c, 39d are about one-thirds the thickness of the frame 102, and partially contact the outer periphery of the pin 36. The resistance provided by the retainer portions to the inserted pin 36 is smaller than in the case where the retainer portion 39 entirely contacts the outer periphery of the pin 36. As a result, no undesirable plastic deformations occur in the vicinity of the positioning hole 37. Accordingly, the flatness of the plates 11-14 can be maintained when bonded together. This is especially effective when the lead frames 100a-100d are very thin.

The retainer portions 39, 39a-39d in FIGS. 11A, 11B, and 12A-12D, which are about one-thirds the thickness of the frame 102, are formed by half-etching. Half-etching achieves a lower degree of accuracy than full-etching for forming through holes. Thus, the positioning hole 37 is likely to be off-centered and the retainer portions 39, 39a-39d are likely to be irregularly deformed, resulting in misalignment between the lead frames 100a-100d and the pin 36.

Figure 13A:
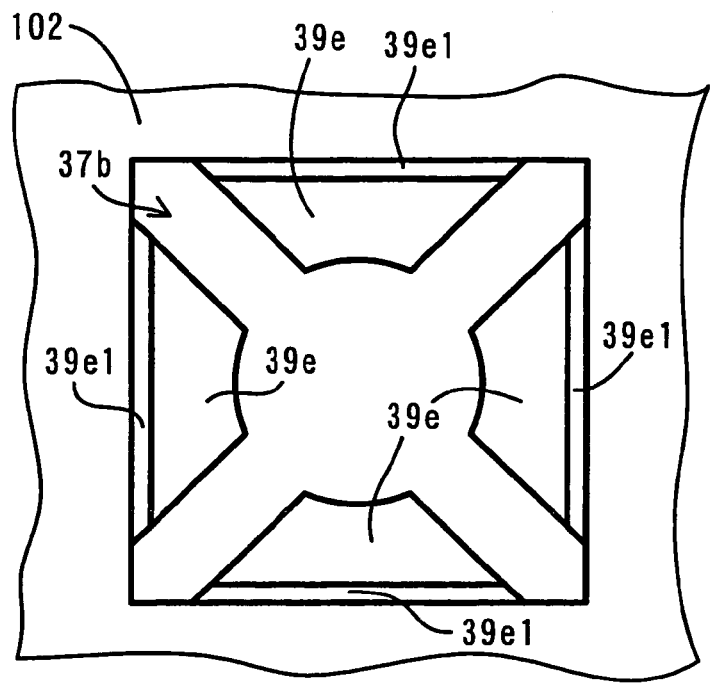
FIG. 13A is a plan view of another positioning hole and retainer portions.
Figure 13B:
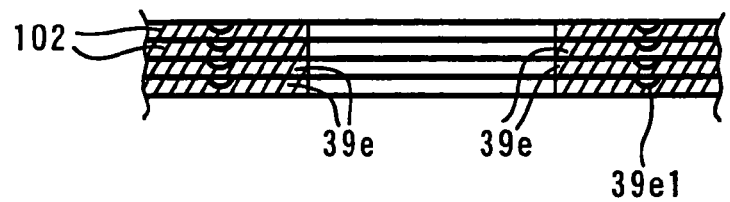
FIG. 13B is a cross-sectional view of FIG. 13A.

Alternatively, as shown in FIGS. 13A and 13B, a positioning hole 37b is formed to be rectangular in the plan view, and four retainer portions 39e extend inwardly from the four sides of the rectangle. Each retainer portion 39e has a groove 39e1 along each side of the rectangle so as to reduce the thickness. On the other hand, the free end of each retainer portion 39e, which contacts a pin 36, is as thick as the frame 102.

Figure 13C:
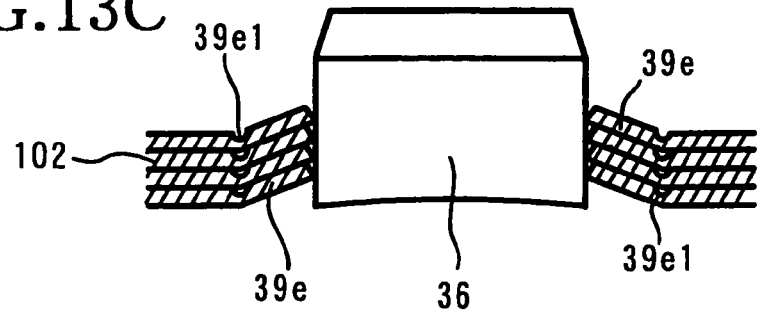
FIG. 13C is a cross-sectional view of a pin inserted into the positioning hole.

The inner periphery of each retainer portion 39e is formed with a high degree of precision by full-etching. In addition, when the pin 36 is inserted as shown in FIG. 13C, the retainer portions 39e are bent at the grooves 39e1 without being irregularly deformed. Accordingly, the lead frames 100a-100d can be laminated in proper alignment.

In the above-described embodiment, the connecting pieces 106 are formed at central portions of the opposed lateral sides of each plate 11-14 and are connected to the frame 102. In order to obtain cavity plates 9, each of which is made up of a set of laminated plates 11-14, from the laminated lead frames 100a-100d, four-layered connecting pieces 106 must be cut.

Because a shearing force exerted when the connecting pieces 106 are cut is so great that the adhesive 42 applied near the connecting pieces 106 may be removed. A cavity plate 9 with the adhesive 42 partially removed is defective. Thus, a good chance of removal of the adhesive 42 will reduce productivity.

The ink supply holes 19a, 19b formed near the connecting pieces 106 may also be deformed due to such a great shearing force, and ink leaks may be caused.

Figure 14:
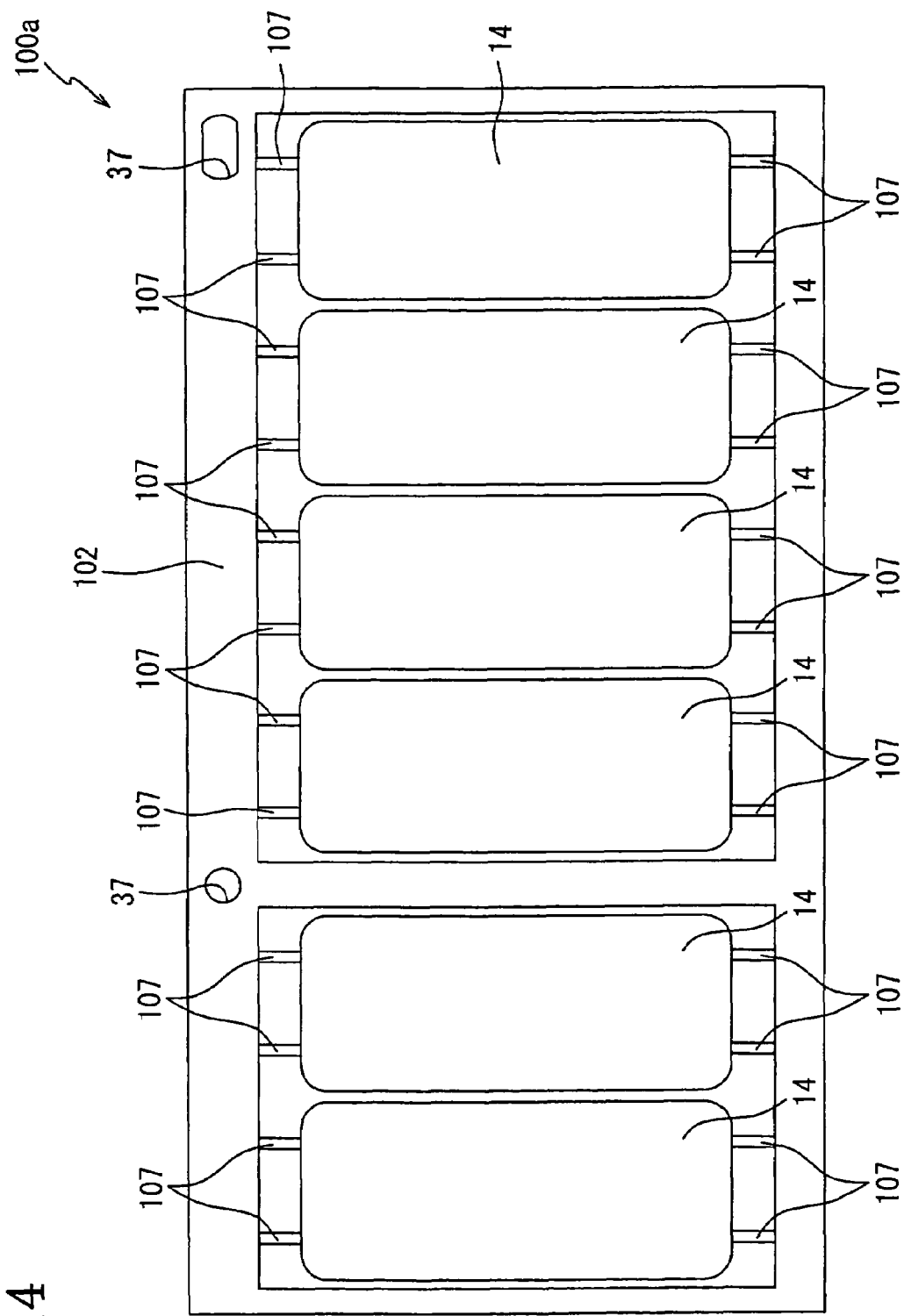
FIG. 14 is a plan view of a lead frame to which base plates are connected by connecting pieces provided for lateral sides of each base plate.

In FIG. 14, each base plate 14 is connected to the frame 102 by two connecting pieces 107 provided for each side of the base plate 14, that is, by a total of four connecting pieces 107 provided for both sides thereof.

Figure 15A:
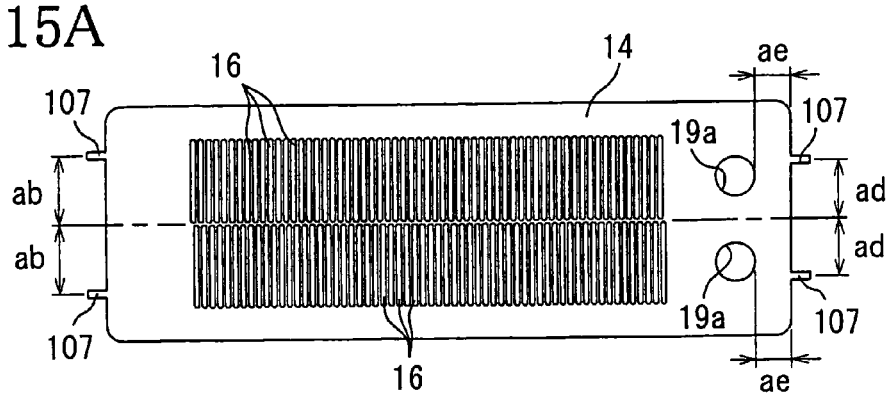
FIG. 15A is a plan view of a base plate showing a layout of connecting pieces.

More specifically, as shown in FIG. 15A, two connecting pieces 107 are provided for each lateral side of the rectangular base plate 14, and a total of four connecting pieces 107 are provided for both lateral sides thereof. Two connecting pieces 107 are provided for the lateral side far away from the supply holes 19a (left side in FIG. 15A) at a distance ab away from the longitudinal center line. For the lateral side near the supply holes 19a (right side in FIG. 15a), two connecting pieces 107 are also provided at a distance ad away from the longitudinal center line of the base plate 14. The supply holes 19a are provided at a distance ae away from the lateral side of the base plate 14.

Figure 15B:
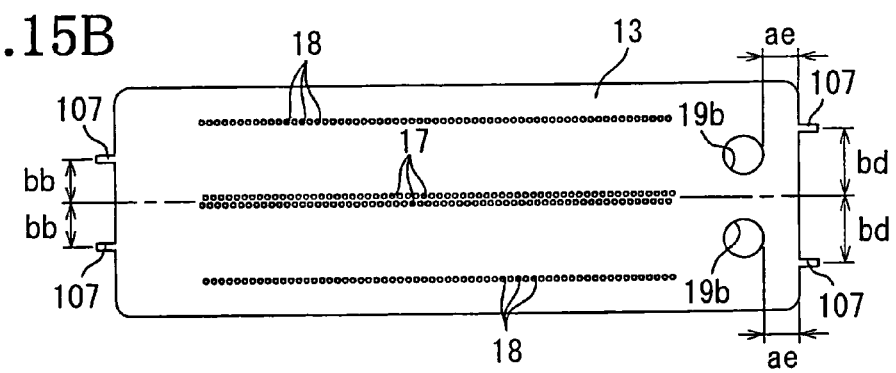
FIG. 15B is a plan view of a spacer plate showing a layout of connecting pieces.

As shown in FIG. 15B, two connecting pieces 107 are provided for each lateral side of the rectangular spacer plate 13, and a total of four connecting pieces 107 are provided for both lateral sides thereof. Two connecting pieces 107 are provided for the lateral side far away from the supply hole 19b (left side in FIG. 15B) at a distance bb away form the longitudinal center line. For the lateral side near the supply holes 19b (right side in FIG. 15B), two connecting pieces 107 are also provided at a distance bd away from the longitudinal center line of the spacer plate 13. The supply holes 19b are provided at a distance ae away from the lateral side of the spacer plate 13.

Figure 15C:
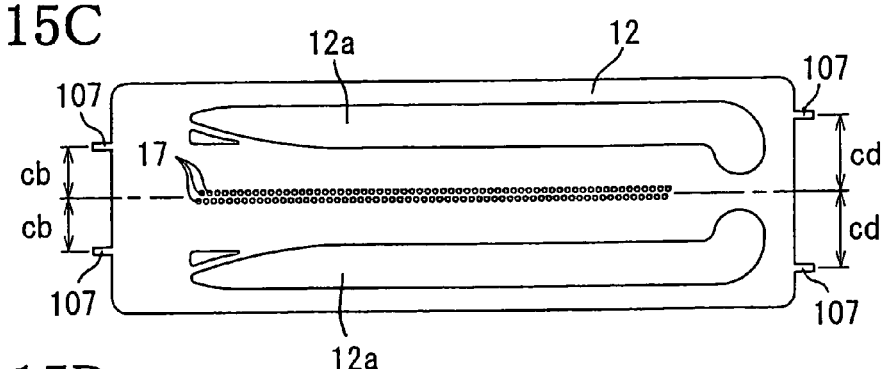
FIGS. 15C and 15D are plan views of manifold plates each showing a layout of connecting pieces.

As shown in FIG. 15C, two connecting pieces 107 are provided for each lateral side of the rectangular manifold plate 12, and a total of four connecting pieces 107 are provided for both lateral sides thereof. Two connecting pieces 107 are provided for the lateral side far away from the supply holes 19a, 19b (left side in FIG. 15C) at a distance cb away from the longitudinal center line. For the lateral side near the supply holes 19a, 19b (right side in FIG. 15C), two connecting pieces 107 are also provided at a distance cd away from the longitudinal center line of the manifold plate 12.

Figure 15D:
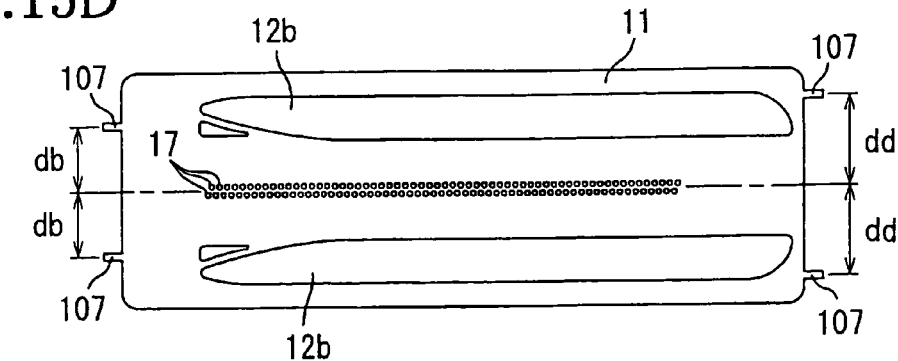

As shown in FIG. 15D, two connecting pieces 107 are provided for each lateral side of the rectangular manifold plate 11, and a total of four connecting pieces 107 are provided for both lateral sides thereof. Two connecting pieces 107 are provided for the lateral side far away from the supply holes 19a, 19b (left side in FIG. 15D) at a distance db away from the longitudinal center line. For the lateral side near the supply holes 19a, 19b (right side in FIG. 15D), two connecting pieces 107 are also provided at a distance dd away from the longitudinal center line of the manifold plate 11.

The distance between the longitudinal center line and each of the connecting pieces 107 in each plate 11-14 will now be described.

The distance between the longitudinal center line and each of the connecting pieces 107 far away from the supply holes 19a, 19b gradually increases in the order of the spacer plate 13, manifold plate 12, manifold plate 11, and base plate 14. This relationship can be expressed as bb<cb<db<ab.

On the other hand, the distance between the longitudinal center line and each of the connecting pieces 107 near the supply holes 19a, 19b gradually increases in the order of the base plate 14, spacer plate 13, manifold plate 12, and manifold plate 11. This relationship can be expressed as ad<bd<cd<dd.

Figure 16A:
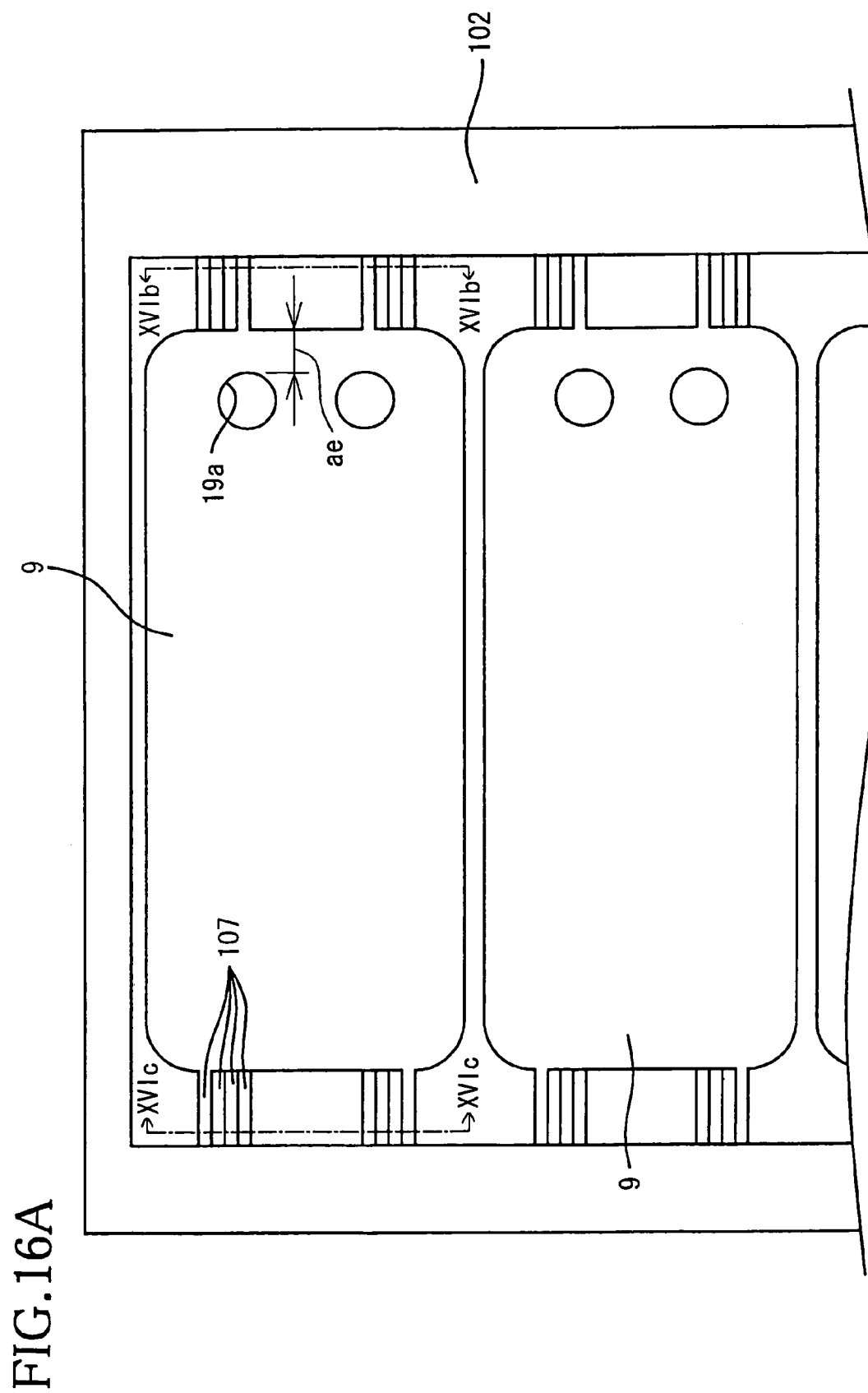
FIG. 16A is a plan view of laminated and bonded lead frames as viewed from the base plate side.
Figure 16B:
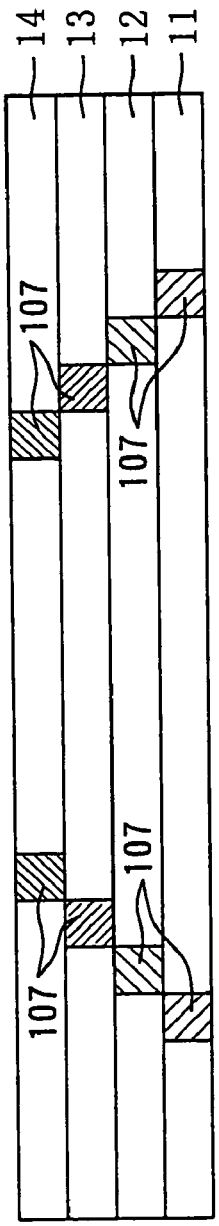
FIG. 16B is a cross-sectional view taken along line XVIb-XVIb.
Figure 16C:
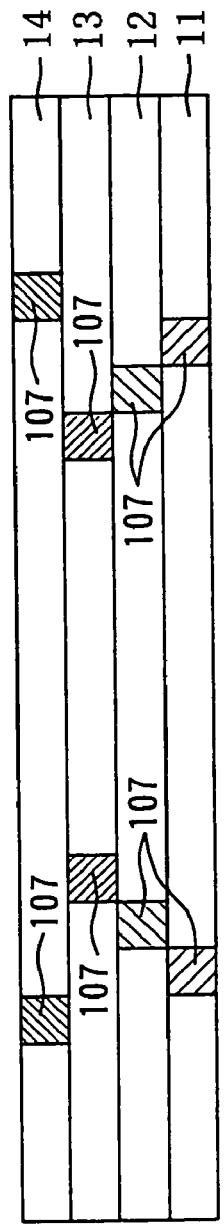
FIG. 16C is a cross-sectional view taken along line XVIc-XVIc.

In FIGS. 16A-16C, the lead frames 100a, 100b, 100c, 100d, respectively having plates 11, 12, 13, 14, are laminated.

FIG. 16A is a top view of the laminated lead frames 100a-100d as viewed from the side of base plates 14. FIG. 16B shows the connecting pieces 107 as viewed from the side provided with the supply holes 19a, 19b (right side of FIG. 16A). Because the locations of the connecting pieces 107 vary among the plates 11, 12, 13, 14, as described above, the connecting pins 107 provided on both sides of the plates 11-14 do not overlap in the plan view.

In this case, a small shearing force is sufficient to cut the connecting pieces 107 from the frames 102 of the laminated lead frames 100a-100d to obtain cavity plates 9. Thus, the cavity plates 9 can be easily separated from the frames 102. In addition, mechanical stress applied to the cavity plates 9 during cutting can be reduced. This prevents deformations of the plates 11-14, removal of the adhesive 42, and ink leaks.

Additionally, because two adjacent connecting pieces 107 are disposed equidistantly from the longitudinal center line of each plate 11-14, the shearing force exerted upon cutting the connecting pieces 107 from the frames 102 can be distributed evenly to the two adjacent connecting pieces. This is very effective in producing a cavity plate 9 with high accuracy.

The supply holes 19a, 19b are provided as far away as possible from the connecting pieces 107. If deformations of the plates 11-14 and removal of the adhesive 42 occur due to the mechanical stress generated during cutting, removed adhesive 42 is unlikely to reach the supply holes 19a, 19b. Thus, defective cavity plates can be reduced.

Because the connecting pieces 107 are provided for the lateral sides of each plate 11-14, small number of connecting pieces 107 suffice for holding each plate 11-14 to the associated frame 102. This facilitates cutting the connecting pieces 107 from the frames 102 to obtain cavity plates 9.

Because two connecting pieces 107 are provided for each lateral side of each plate 11-14 equidistantly from the longitudinal center line of each plate 11-14 and symmetrically with respect to the longitudinal center line, the connecting plates 107 can be easily cut from the frames 102.

Although the invention has been described with reference to the embodiment applied to assembly of an ink-jet head, the above-described method can be also applied to form an integral circuit board by laminating a plurality of circuits each having an electrically conductive pattern.

While the invention has been described with reference to a specific embodiment, the description of the specific embodiment is illustrative only and is not to be construed as limiting the scope of the invention. Various other modifications and changes may occur to those skilled in the art without departing from the spirit and scope of the invention.

What is claimed is:

1. A method for laminating a plurality of thin plate parts, comprising:
    providing a plurality of thin plate parts side by side in each of a plurality of frames, each one of the plurality of frames having a positioning hole with a deformable retainer portion within the positioning hole; and
    inserting a pin into the positioning hole of each one of the plurality of frames while stacking the plurality of frames to cause the retainer portion of the positioning hole to deform to align the plurality of frames with each other,
    wherein the pin is surrounded by the retainer portion,
    wherein the deformable retainer portion contacts an inner surface of the positioning hole, and
    wherein for each of the frames, at least a part of the retainer portion that contacts the inner surface of the positioning hole has a thickness that is thinner than the thickness of the frame.

2. The method of claim 1, further comprising the step of applying an adhesive to each of the plurality of thin plate parts.

3. The method of claim 1, wherein the retainer portion deforms plastically.

4. The method of claim 1, wherein the retainer portion includes at least three projections that extend inwardly from an inner periphery of the positioning hole.

5. A method for manufacturing a laminated product from thin plate parts, comprising:

providing a plurality of thin plate parts side by side in a frame by interposing a connecting piece, smaller in width than each of the plurality of thin plate parts, between each of the plurality of thin plate parts and the frame, the frame having a positioning hole with a deformable retainer portion within the positioning hole;

repeating the providing step to prepare a plurality of frames;

applying an adhesive to each of the plurality of thin plate parts;

inserting a pin into the positioning hole of each of the plurality of frames while stacking the plurality of frames, the inserted pin deforming the retainer portion of each of the positioning holes so as to align the plurality of frames with each other; and cutting the connecting piece from each of the plurality of thin plate parts to remove laminated thin plate parts from the stacked frames, wherein the pin is surrounded by the retainer portion, wherein the deformable retainer portion contacts an inner surface of the positioning hole, and wherein for each of the frames, at least a part of the retainer portion that contacts the inner surface of the positioning hole has a thickness that is thinner than the thickness of the frames.

6. The method of claim 5, wherein the connecting piece is located at a different position in each of the laminated thin plate parts.

7. A method for manufacturing a laminated product from thin plate parts, comprising:

providing a plurality of thin plate parts side by side in a frame by interposing a connecting piece, smaller in width than each plate part, between each thin plate part and the frame;

repeating the providing step to prepare a plurality of frames, the connecting piece of each thin plate part being located at a different position among the plurality of frames;

applying an adhesive to each of the plurality of thin plate parts;

retaining a pin in a positioning hole of each of the plurality of frames by deforming a deformable retainer portion that surrounds the pin;

stacking the plurality of frames to laminate thin plate parts, the locations of the connecting pieces of the laminated thin plate parts being shifted with respect to each other in plan view; and cutting the connecting piece from each of the plurality of thin plate parts to remove the laminated thin plate parts from the stacked frames, wherein the deformable retainer portion contacts an inner surface of the positioning hole, and wherein for each of the frames, at least a part of the retainer portion that contacts the inner surface of the position in hole has a thickness that is thinner than the thickness of the frame.

8. The method of claim 7, wherein each one of the plurality of thin plate parts comprises a circuit having an electrically conductive pattern.

9. The method of claim 4, wherein the at least three projections have a convex and semicircular end.

10. The method of claim 4, wherein the at least three projections each have a linear end portion.

11. The method of claim 4, wherein the retainer portion includes a groove disposed at the positioning hole perimeter.

12. The method of claim 5, wherein each one of the plurality of thin plate parts comprises a circuit having an electrically conductive pattern.

13. The method of claim 1, wherein each one of the plurality of thin plate parts comprises a circuit having an electrically conductive pattern.

* * * * *